(12) United States Patent
Walker et al.

(10) Patent No.: US 11,674,992 B2
(45) Date of Patent: *Jun. 13, 2023

(54) ELECTROMETER WITH RYDBERG FREQUENCY TUNING

(71) Applicant: NORTHROP GRUMMAN SYSTEMS CORPORATION, Falls Church, VA (US)

(72) Inventors: Thad G. Walker, Middleton, WI (US); Eric A. Imhof, Albuquerque, NM (US); Steven Ryan Jefferts, Woodland Hills, CA (US)

(73) Assignee: NORTHROP GRUMMAN SYSTEMS CORPORATION, Falls Church, VA (US)

(*) Notice: Subject to any disclaimer, the term of this patent is extended or adjusted under 35 U.S.C. 154(b) by 0 days.

This patent is subject to a terminal disclaimer.

(21) Appl. No.: 17/552,854

(22) Filed: Dec. 16, 2021

(65) Prior Publication Data

US 2022/0196718 A1   Jun. 23, 2022

Related U.S. Application Data

(60) Provisional application No. 63/126,963, filed on Dec. 17, 2020, provisional application No. 63/126,687, filed on Dec. 17, 2020.

(51) Int. Cl.
   *G01R 29/12*   (2006.01)
(52) U.S. Cl.
   CPC ................... *G01R 29/12* (2013.01)
(58) Field of Classification Search
   CPC .......................... G01R 29/12; G01R 29/0885
   USPC .......................................................... 324/457
   See application file for complete search history.

(56) References Cited

U.S. PATENT DOCUMENTS

| | | | |
|---|---|---|---|
| 4,147,979 A * | 4/1979 | Baues | G01R 29/12 |
| | | | 385/12 |
| 2015/0042327 A1 | 2/2015 | Bulatowicz | |
| 2016/0202062 A1 | 7/2016 | Griffith | |
| 2016/0202083 A1 | 7/2016 | Bulatowicz et al. | |
| 2016/0363617 A1* | 12/2016 | Anderson | G01R 29/0885 |

(Continued)

OTHER PUBLICATIONS

International Search Report for corresponding PCT/US2021/063815, dated Apr. 12, 2022, attached hereto.

*Primary Examiner* — Christopher P McAndrew
(74) *Attorney, Agent, or Firm* — Tarolli, Sundheim, Covell & Tummino LLP

(57) ABSTRACT

One embodiment includes an electrometer system. The system includes a sensor cell comprising alkali metal atoms within, and an optical beam system configured to provide at least one optical beam through the sensor cell to provide a first Rydberg energy state of the alkali metal atoms, the at least one optical beam exiting the sensor cell as a detection beam. The system also includes a tuning signal generator configured to generate a tuning signal having a predetermined tuning frequency to adjust an energy difference between the first Rydberg energy state and a second Rydberg energy state of the alkali metal atoms. The system further includes a detection system configured to monitor the detection beam to detect an external signal having a frequency that is approximately equal to the energy difference between the first Rydberg energy state and the second Rydberg energy state based on monitoring the detection beam.

19 Claims, 3 Drawing Sheets

(56) References Cited

U.S. PATENT DOCUMENTS

2019/0072600 A1* 3/2019 Schubert ............... H01S 5/0657
2019/0101611 A1 4/2019 Bulatowicz et al.
2020/0341081 A1 10/2020 Mohseni et al.

* cited by examiner

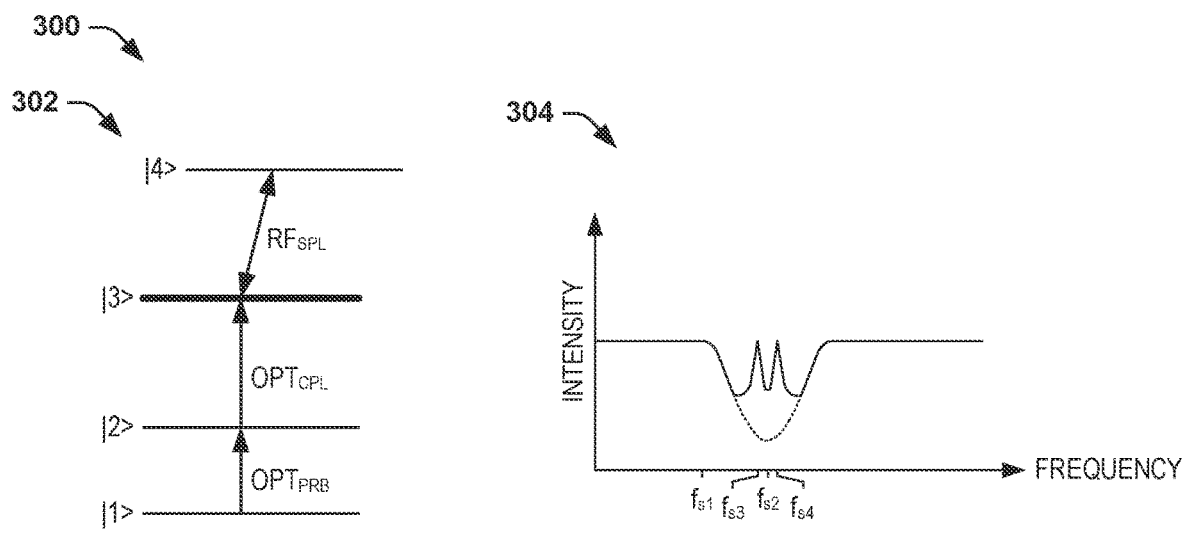
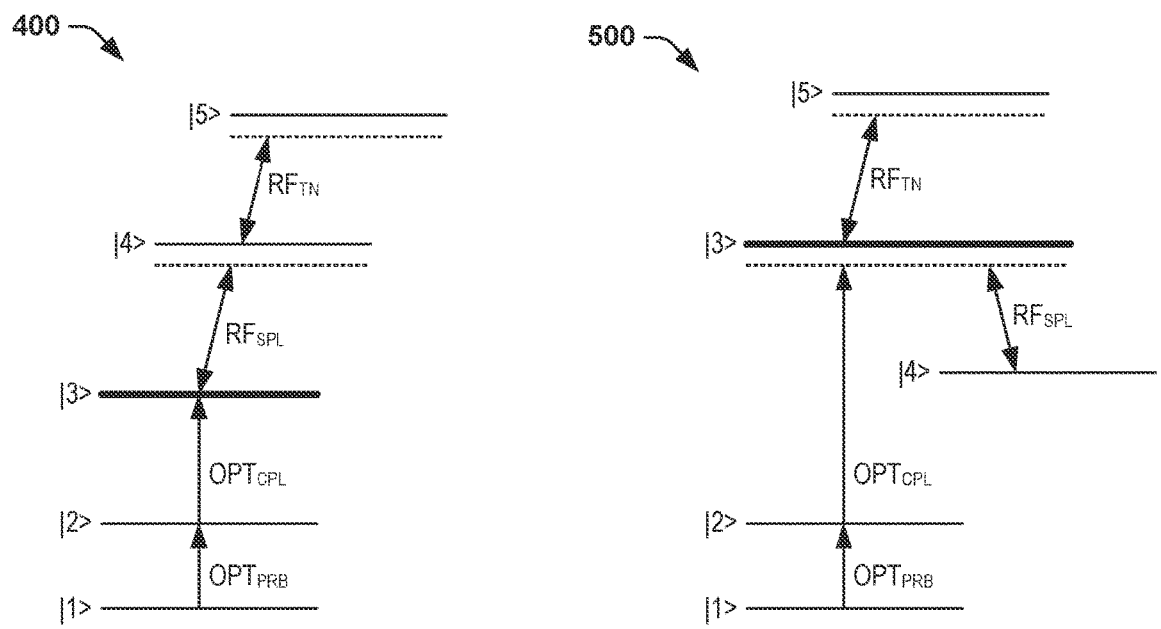
FIG. 3
FIG. 4
FIG. 5

ELECTROMETER WITH RYDBERG FREQUENCY TUNING

CROSS REFERENCE TO RELATED APPLICATION

This application claims priority from U.S. Provisional Patent Application No. 63/126,687, filed 17 Dec. 2020, and from U.S. Provisional Patent Application No. 63/126,963, filed 17 Dec. 2020, which are both incorporated herein by reference in their entirety.

TECHNICAL FIELD

The present invention relates generally to sensor systems, and specifically to an electrometer with Rydberg frequency tuning.

BACKGROUND

Electric field measurement via electrometers has many useful applications. Detectable electric fields can include DC electric fields, as well as AC electric fields (e.g., radio frequency (RF) fields which can correspond to communications signals). The detection of electric fields can be implemented for anti-spoofing and/or anti-jamming capability in electronic warfare environments. For example, if a jamming or spoofing signal can be detected, then the jamming signal or spoofing signal can be filtered or demodulated out to provide for a baseband signal of interest without undesired or adversarial interference. As an example, multiple antennas arranged in an array can provide for directional detection of a signal, such as to provide a detectable directional of a source of the signal.

SUMMARY

One embodiment includes an electrometer system. The system includes a sensor cell comprising alkali metal atoms within, and an optical beam system configured to provide at least one optical beam through the sensor cell to provide a first Rydberg energy state of the alkali metal atoms, the at least one optical beam exiting the sensor cell as a detection beam. The system also includes a tuning signal generator configured to generate a tuning signal having a predetermined tuning frequency to adjust an energy difference between the first Rydberg energy state and a second Rydberg energy state of the alkali metal atoms. The system further includes a detection system configured to monitor the detection beam to detect an external signal having a frequency that is approximately equal to the energy difference between the first Rydberg energy state and the second Rydberg energy state based on monitoring the detection beam.

Another example includes a method for detecting an external signal via an electrometer system. The method includes directing a probe beam through a sensor cell comprising an alkali metal atoms in a first direction and directing a coupling beam through the sensor cell collinearly and anti-parallel with the probe beam to provide a first Rydberg energy state of the alkali metal atoms. The method also includes providing a splitting signal having a predetermined frequency through the sensor cell to provide a pair of Autler-Townes frequency-spectrum transparency peaks associated with the alkali metal atoms, and providing a tuning signal having a predetermined tuning frequency through the sensor cell to adjust an energy difference between the first Rydberg energy state and a second Rydberg energy state of the alkali metal atoms. The method further includes monitoring a detection beam corresponding to the probe beam exiting the sensor cell to detect the external signal in response to observing a change in the pair of Autler-Townes frequency-spectrum transparency peaks.

Another example includes electrometer system. The system includes a sensor cell comprising alkali metal atoms within and a probe laser configured to generate a probe beam directed through the sensor cell in a first direction, the probe beam exiting the sensor cell as the detection beam. The system also includes a coupling laser configured to generate a coupling beam directed through the sensor cell collinearly and anti-parallel with the probe beam to provide a first Rydberg energy state of the alkali metal atoms, and a tuning signal generator configured to generate a tuning signal having a predetermined tuning frequency to adjust an energy difference between the first Rydberg energy state and a second Rydberg energy state of the alkali metal atoms. The system further includes a detection system configured to monitor the detection beam to detect an external signal having a frequency that is approximately equal to the energy difference between the first Rydberg energy state and the second Rydberg energy state based on monitoring the detection beam.

BRIEF DESCRIPTION OF THE DRAWINGS

FIG. 3 illustrates an example diagram of optical detection.

FIG. 4 illustrates an example of an energy state diagram.

FIG. 5 illustrates another example of an energy state diagram.

DETAILED DESCRIPTION

Figure 1:
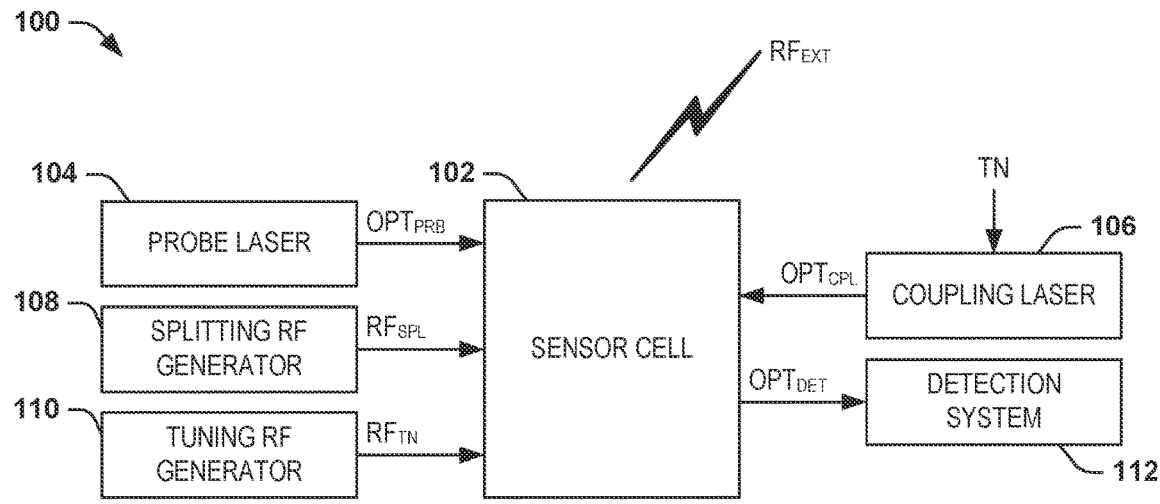
FIG. 1 illustrates an example diagram of an electrometer system.

The present invention relates generally to sensor systems, and specifically to an electrometer with Rydberg frequency tuning. The electrometer system can include a sensor cell containing a vapor of alkali metal atoms enclosed within. The electrometer system also includes a probe laser and a coupling laser that are configured to generate a probe beam and a coupling beam, respectively. Each of the probe beam and the coupling beam can be provided through the sensor cell via a set of optics. The probe beam and coupling beams can take any mutually intersecting path through the sensor cell, including but not limited to paths in which the probe beam and the coupling beams are arranged collinearly and anti-parallel with each other. The probe beam may exit the sensor cell traveling in the opposite direction as the coupling beams. After exiting the sensor cell, the probe beam can be isolated and interrogated as a detection beam. The probe beam and the coupling beam can be tuned to respective frequencies and powers to excite certain atoms within the alkali metal vapor to a first Rydberg energy state. The number and properties of atoms in this first Rydberg energy state can be determined by measuring the power and phase of the detection beam. For example, if the power of the detection beam plotted as a function of detection beam frequency, a peak of transmitted light can be detected for frequencies corresponding to the excitation of the first Rydberg energy state.

The electrometer system also includes a splitting signal generator configured to generate a splitting signal having a predetermined frequency and a predetermined amplitude through the sensor cell. As an example, the splitting signal generator can provide the splitting signal to split a frequency-spectrum transparency peak corresponding to the first Rydberg energy state of the alkali metal atoms into a pair of Autler-Townes frequency-spectrum transparency peaks associated with the alkali metal atoms when the frequency of the splitting signal is approximately equal to the energy difference between the first Rydberg energy state and a second Rydberg energy state.

As an example, the amount of frequency between the Autler-Townes frequency-spectrum transparency peaks is proportional to the splitting signal amplitude. If, for example, an external signal interacts with the alkali metal atoms, and the external signal has the same frequency as the splitting signal, then the external signal can modify the amount of frequency between the Autler-Townes frequency-spectrum transparency peaks. By measuring the amount of frequency splitting between the Autler-Townes frequency-spectrum transparency peaks before and after the external signal arrived, the amplitude of the external signal can be known. In this way, any external signal with a frequency corresponding to the energy between the first Rydberg energy state and any other second Rydberg state can be measured. However, if a different external signal is to be measured, and the frequency of the different external signal does not correspond to the energy difference between the first Rydberg energy state and a second Rydberg energy state, then the measurement is either degraded or made impossible. To measure these different external signals, the energy difference between the first Rydberg energy state and a second Rydberg energy state can be modified to match the different external signal frequency, as described herein.

The electrometer system also includes a tuning signal generator configured to provide a tuning signal. The tuning signal can be provided at a predetermined frequency and amplitude to be able to adjust an energy difference between the first Rydberg energy state and the second Rydberg energy state, such that the adjusted energy difference is approximately equal to the frequency of the splitting signal and the external signal. Therefore, the splitting signal can provide the defined Autler-Townes pair of frequency-spectrum transparency peaks. For example, the predetermined frequency of the tuning signal can be approximately equal to an energy difference between the second Rydberg energy state and a third Rydberg energy state, and can be provided with sufficient amplitude to provide a change in the energy levels of the second and third Rydberg energy states, such that the second Rydberg energy state can be adjusted relative to the first Rydberg energy state. Therefore, an external signal having a frequency that is approximately equal to the splitting signal, and thus approximately equal to the adjusted second Rydberg energy state relative to the first Rydberg energy state, can be detected.

The electrometer system further includes a detection system configured to monitor the detection beam to detect the external signal. The detection system can include a photodetector that can monitor an intensity and/or phase of the detection beam, and can determine a change in the pair of Autler-Townes frequency-spectrum transparency peaks that correspond to the presence of the external signal. Therefore, by being able to tune the energy difference between the first and second Rydberg energy states, the electrometer system can be tuned to detect an external signal having substantially any frequency based on discrete Rydberg energy states.

FIG. 1 illustrates an example diagram of an electrometer system 100. The electrometer system 100 can be implemented in any of a variety of applications, such as to detect an external electromagnetic signal of any frequency.

The electrometer system 100 includes a sensor cell 102 that can be configured as a sealed glass container that includes a vapor of alkali metal atoms. As an example, the alkali metal vapor can be rubidium (Rb), or any of a variety of other types of alkali metals (e.g., cesium (Cs)). As described herein, the alkali metal vapor can be excited to a Rydberg energy state, such that the alkali metal vapor can be substantially insensitive to absorption of photons of light of a specific frequency (e.g., is approximately transparent). The electrometer system 100 also includes a probe laser 104 that is configured to generate a probe beam $OPT_{PRB}$ and a coupling laser 106 that is configured to generate a coupling beam $OPT_{CPL}$. As an example, each of the probe beam $OPT_{PRB}$ and the coupling beam $OPT_{CPL}$ can be provided through the sensor cell 102 via optics (not shown) in a manner such that the probe beam $OPT_{PRB}$ and the coupling beam $OPT_{CPL}$ can each be collimated (e.g., via optics) and provided collinearly and anti-parallel with respect to each other. However, other arrangements for providing intersection of the probe beam $OPT_{PRB}$ and the coupling beam $OPT_{CPL}$ for stimulating the alkali metal vapor to the Rydberg state can be provided instead.

As an example, the probe beam $OPT_{PRB}$ and the coupling beam $OPT_{CPL}$ can be tuned to respective frequencies to provide a first Rydberg energy state of the alkali metal vapor, such that the alkali metal vapor is excited to populate the first Rydberg energy state. While the example of FIG. 1 demonstrates a single coupling laser 106, multiple coupling lasers can be implemented to provide multiple respective coupling beams $OPT_{CPL}$ of differing frequencies to excite the alkali metal vapor to the first Rydberg energy state, as described herein. The probe beam $OPT_{PRB}$ can exit the sensor cell 102 as a detection beam $OPT_{DET}$. In the example of FIG. 1, the coupling laser 106 is demonstrated as receiving a wavelength tuning signal TN that is configured to tune the wavelength of the coupling beam $OPT_{CPL}$, as described in greater detail herein.

The electrometer system 100 also includes a splitting signal generator 108 that is configured to generate a splitting signal $RFs_{SPL}$. The splitting signal $RF_{SPL}$ can be a radio frequency (RF) signal that is provided at a predetermined frequency and a predetermined amplitude through the sensor cell 102. As an example, the splitting signal generator 108 can provide the splitting signal $RF_{SPL}$ to split a frequency-spectrum transparency peak corresponding to the first Rydberg energy state of the alkali metal atoms into a pair of Autler-Townes frequency-spectrum transparency peaks associated with the alkali metal atoms when the frequency of the splitting signal $RF_{SPL}$ is approximately equal to the energy difference between the first Rydberg energy state and a second Rydberg energy state. The splitting signal $RF_{SPL}$ can be set to a frequency, for example, that corresponds to a frequency of an external signal that is desired to be detected by the electrometer system, as described herein.

The electrometer system 100 also includes a tuning signal generator 110 configured to generate a tuning signal $RF_{TN}$. The tuning signal $RF_{TN}$ can be provided at a predetermined frequency and amplitude to be able to adjust an energy difference between the first Rydberg energy state and a second Rydberg energy state. For example, the predetermined frequency of the tuning signal $RF_{TN}$ can be approximately equal to an energy difference between the second Rydberg energy state and a third Rydberg energy state, and can be provided with sufficient amplitude to provide a change in the energy levels of the second and third Rydberg energy states. As a result, the second Rydberg energy state can be adjusted relative to the first Rydberg energy state. As another example, the first Rydberg energy state can be adjusted relative to the second Rydberg energy state. The adjusted energy difference can be approximately equal to the frequency of the splitting signal $RF_{SPL}$.

The electrometer system 100 further includes a detection system 112 that is configured to monitor the detection beam $OPT_{DET}$ to detect the external signal $RF_{EXT}$. The detection system 112 can include a photodetector that can monitor an intensity and/or phase of the detection beam $OPT_{DET}$. As described above, the splitting signal $RF_{SPL}$ can provide a defined pair of Autler-Townes frequency-spectrum transparency peaks associated with the alkali metal atoms in response to the splitting signal $RF_{SPL}$ having a frequency that is approximately equal to the energy difference between the first Rydberg energy state and the second Rydberg energy state. Therefore, in response to the tuning signal $RF_{TN}$ adjusting the energy difference between the first Rydberg energy state and a second Rydberg energy state, the splitting signal $RF_{SPL}$ can provide the defined Autler-Townes pair of transparency peaks in the frequency spectrum of the detection beam $OPT_{DET}$. The detection system 112 can thus determine a change in the pair of Autler-Townes frequency-spectrum transparency peaks that correspond to the presence of the external signal. As a result, an external signal $RF_{EXT}$ having a frequency that is approximately equal to the frequency of the splitting signal $RF_{SPL}$, and thus approximately equal to the energy difference between the adjusted second Rydberg energy state and the first Rydberg energy state, can be detected. Accordingly, by being able to tune the energy difference between the first and second Rydberg energy states, the electrometer system 100 can be tuned to detect an external signal having substantially any frequency based on discrete Rydberg energy states.

Figure 2:
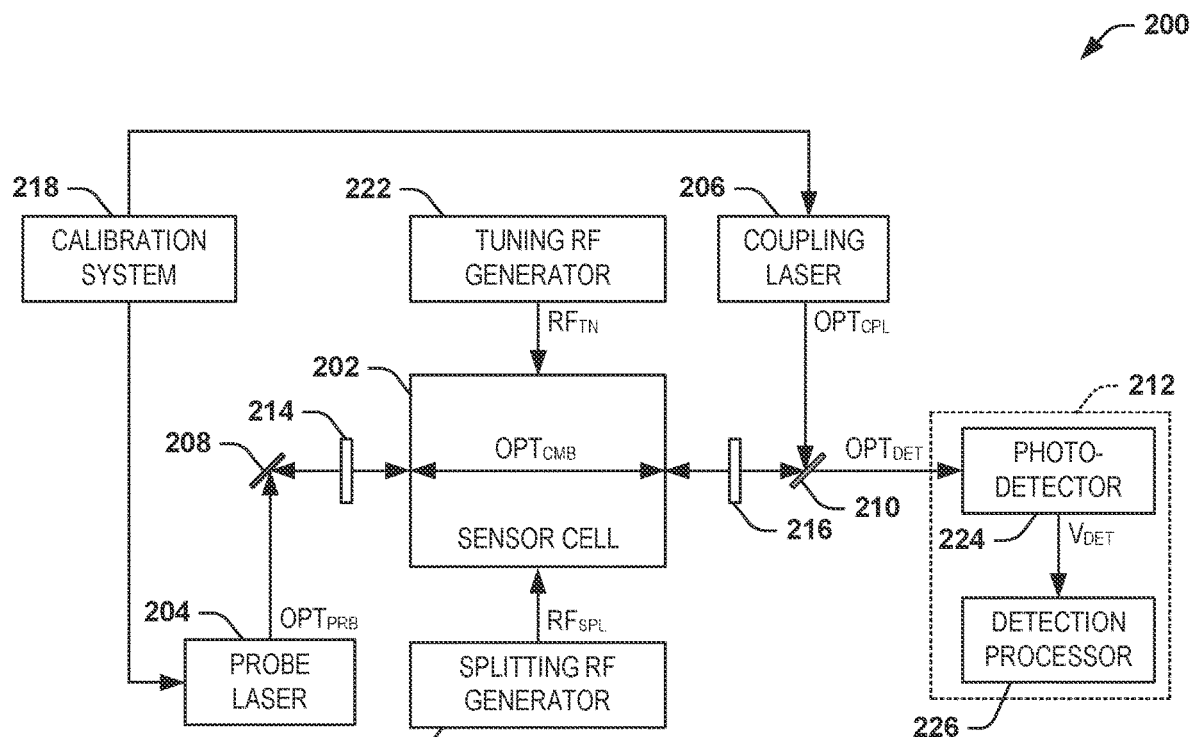
FIG. 2 illustrates another example diagram of an electrometer system.

FIG. 2 illustrates another example diagram of an electrometer system 200. The electrometer system 200 can be implemented in any of a variety of applications in which detection of an external signal $RF_{EXT}$ is desired.

The electrometer system 200 includes a sensor cell 202 that can be configured as a sealed glass container that includes an alkali metal vapor. The electrometer system 200 also includes a probe laser 204 that is configured to generate a probe beam $OPT_{PRB}$ and a coupling laser 206 that is configured to generate a coupling beam $OPT_{CPL}$. The probe beam $OPT_{PRB}$ is provided to a dichroic mirror 208 that is configured to reflect the probe beam $OPT_{PRB}$ into the sensor cell 202. Similarly, the coupling beam $OPT_{CPL}$ is provided to a dichroic mirror 210 that is configured to reflect the coupling beam $OPT_{CPL}$ into the sensor cell 202 and to pass the probe beam $OPT_{PRB}$ through it as a detection beam $OPT_{DET}$ that is monitored by a detection system 212. Similarly, the beam splitter 208 is configured to pass the coupling beam $OPT_{CPL}$. As described in greater detail herein, the probe beam $OPT_{PRB}$ and the coupling beam $OPT_{CPL}$ can be tuned to respective frequencies to provide a first Rydberg energy state of the alkali metal vapor. While the example of FIG. 2 demonstrates a single coupling laser 206, multiple coupling lasers can be implemented to provide multiple respective coupling beams $OPT_{CPL}$ of differing frequencies to excite the alkali metal vapor to the first Rydberg state, as described herein.

Based on the arrangement of the dichroic mirrors 208 and 210, the probe beam $OPT_{PRB}$ and the coupling beam $OPT_{CPL}$ can be provided through the sensor cell 202 in a manner such that the probe beam $OPT_{PRB}$ and the coupling beam $OPT_{CLP}$ are collinear and anti-parallel with respect to each other through the sensor cell 202, demonstrated in the example of FIG. 2 as a beam $OPT_{CMB}$. Additionally, the electrometer system 200 includes collimating optics 214 (e.g., a lens) that can collimate the probe beam $OPT_{PRB}$ along a specific axis in the sensor cell 202, and collimating optics 216 (e.g., a lens) that can collimate the coupling beam $OPT_{CPL}$ along the specific axis in the sensor cell 202, such that the collimation of each of the probe beam $OPT_{PRB}$ and the coupling beam $OPT_{CPL}$ can be provided along the same axis in a collinear and anti-parallel manner. Alternatively, the electrometer system 200 can include focusing optics to focus each of the probe beam $OPT_{PRB}$ and the coupling beam $OPT_{CPL}$ to be collocated in the sensor cell 202 at a measurement point.

In the example of FIG. 2, the electrometer system 200 also includes a calibration system 218 that is configured to tune the frequencies of the probe beam $OPT_{PRB}$ and the coupling beam $OPT_{CPL}$ to respective frequencies to provide a first Rydberg energy state of the alkali metal vapor. As an example, the calibration system 218 can implement a calibration procedure to set the frequencies of the probe beam $OPT_{PRB}$ and the coupling beam $OPT_{CPL}$. As an example, the frequency of the probe beam $OPT_{PRB}$ can be set to excite the alkali metal vapor to a first excited state, and the frequency of the coupling beam $OPT_{CPL}$ can be set to stimulate the excited alkali metal vapor to the first Rydberg energy state, and thus to an electromagnetically-induced transparency. Accordingly, the alkali metal atoms in the first Rydberg energy state can be transparent with respect to light at the approximate frequency of the probe beam $OPT_{PRB}$.

The electrometer system 200 also includes a splitting signal generator 220 that is configured to generate a splitting signal $RF_{SPL}$. The splitting signal $RFs_{SPL}$ can be an RF signal that is provided at a predetermined frequency and a predetermined amplitude through the sensor cell 202. As an example, the splitting signal generator 220 can provide the splitting signal $RF_{SPL}$ to split a frequency-spectrum transparency peak corresponding to the first Rydberg energy state of the alkali metal atoms into a pair of Autler-Townes frequency-spectrum transparency peaks associated with the alkali metal atoms when the frequency of the splitting signal $RF_{SPL}$ is approximately equal to the energy difference between the first Rydberg energy state and a second Rydberg energy state. The splitting signal $RF_{SPL}$ can be set to a frequency, for example, that corresponds to a frequency of an external signal that is desired to be detected by the electrometer system, as described herein.

FIG. 3 illustrates an example diagram 300 of optical detection. The diagram 300 includes an energy state diagram 302 and a graph 304 that demonstrates intensity of the detection beam $OPT_{DET}$ plotted as a function of frequency. The diagram 300 can correspond to optical detection in the electrometer system 200. Therefore, reference is to be made to the example of FIG. 2 in the following description of the example of FIG. 3.

The energy state diagram 302 demonstrates a first energy state (e.g., ground state) |1> at which the alkali metal atoms can begin. As an example, the ground state |1> for rubidium atoms can be $|5S_{1/2}>$. In response to the probe beam $OPT_{PRB}$, a population of the alkali metal atoms can be excited to a first excited state |2>. As an example, the first excited state |2> for rubidium atoms can be $|5P_{3/2}>$ based on an example wavelength of approximately 780 nanometers for the probe beam $OPT_{PRB}$. In response to the coupling beam $OPT_{CPL}$, a population of the excited alkali metal atoms can be further excited to a first Rydberg energy state |3>. Therefore, the alkali metal atoms in the first Rydberg energy state |3> can be transparent with respect to light at the approximate frequency of the probe beam $OPT_{PRB}$. Furthermore, as described above, the splitting signal $RF_{SPL}$ can be provided to the sensor cell 202, which can result in Autler-Townes splitting of the transparency peak of the alkali metal atoms in the frequency spectrum. If the splitting signal $RF_{SPL}$ has a frequency that is approximately equal to an energy difference between the first Rydberg energy state |3> and a defined second Rydberg energy state |4>, then the Autler-Townes pair of transparency peaks in the frequency spectrum can be well defined and detectable.

The graph 304 plots an intensity of the detection beam $OPT_{DET}$ as a function of frequency. In the example of FIG. 3, the graph 304 demonstrates an intensity of approximately 100% of the intensity of the detection beam $OPT_{DET}$, and thus substantially no absorption of photons of the probe beam $OPT_{PRB}$ by the alkali metal vapor. The intensity begins to decrease at a frequency $f_{s1}$ to an absorption peak at a frequency $f_{s2}$ corresponding to maximum absorption of the photons of the probe beam $OPT_{PRB}$ by the alkali metal vapor, and thus a minimum intensity of the detection beam $OPT_{DET}$. The minimum intensity is demonstrated at an inverse peak dotted line in the example of FIG. 4, which would correspond to maximum absorption of the photons of the probe beam $OPT_{PRB}$ absent the coupling beam $OPT_{CPL}$. However, based on the interaction of the alkali metal vapor with the probe beam $OPT_{PRB}$, the coupling beam $OPT_{CPL}$, and the splitting signal $RF_{SPL}$, the alkali metal vapor can exhibit transitions between the first and second Rydberg states. Therefore, the alkali metal vapor can be substantially insensitive to absorption of the photons of the probe beam $OPT_{PRB}$ at each of two frequencies $f_{s3}$ and $f_{s4}$ that are approximately equal and opposite the maximum absorption frequency $f_{s2}$ on the frequency spectrum.

The diagram 300 thus demonstrates the effect of Autler-Townes splitting of the electromagnetically-induced transparency peak in response to the splitting signal $RF_{SPL}$ having a frequency that is approximately equal to the energy difference between the first Rydberg energy state and a second defined Rydberg energy state. Therefore, an external signal $RF_{EXT}$ having a frequency that is approximately equal to the frequency of the splitting signal $RF_{SPL}$ can be detected based on monitoring a change in the Autler-Townes pair of transparency peaks in the frequency spectrum of the detection beam $OPT_{DET}$ (e.g., based on a change in the location of the Autler-Townes pair of transparency peaks in the frequency spectrum of the detection beam $OPT_{DET}$ relative to each other). Therefore, the splitting signal $RF_{EXT}$ can be provided at a frequency that corresponds to detecting an external signal $RF_{EXT}$ of approximately the same frequency. However, such detection is limited to the discrete Rydberg energy states. For example, if the splitting signal $RF_{SPL}$ is provided at a frequency that is not equal to an energy difference between the first Rydberg energy state and another Rydberg energy state, then the Autler-Townes pair of transparency peaks in the frequency spectrum are distorted, rendering detection of an external signal of approximately equal frequency as the splitting signal $RF_{SPL}$ to be difficult or impossible. Therefore, as described herein, to detect an external signal $RF_{EXT}$ that has a frequency that is not equal to an energy difference between the first Rydberg energy state and another Rydberg energy state, the electrometer system 200 is configured to adjust the energy difference between the first Rydberg energy state and a second Rydberg energy state.

Referring back to the example of FIG. 2, the electrometer system 200 also includes a tuning signal generator 222 configured to generate a tuning signal $RF_{TN}$. The tuning signal $RF_{TN}$ can be provided at a predetermined frequency and amplitude to be able to adjust an energy difference between the first Rydberg energy state and a second Rydberg energy state. For example, the predetermined frequency of the tuning signal $RF_{TN}$ can be approximately equal to an energy difference between the second Rydberg energy state and a third Rydberg energy state, and can be provided with sufficient amplitude to provide a change in the energy levels of the second and third Rydberg energy states. The adjusted energy difference can be approximately equal to the frequency of the splitting signal $RF_{SPL}$, thereby enabling detection of the external signal $RF_{EXT}$ at substantially any frequency.

FIG. 4 illustrates an example of an energy state diagram 400. The diagram 400 can correspond to optical detection in the electrometer system 200. Therefore, reference is to be made to the example of FIG. 2 in the following description of the example of FIG. 4.

The energy state diagram 402 demonstrates a first energy state (e.g., ground state) |1> at which the alkali metal atoms can begin. In response to the probe beam $OPT_{PRB}$, a population of the alkali metal atoms can be excited to a first excited state |2>. In response to the coupling beam $OPT_{CPL}$, a population of the excited alkali metal atoms can be further excited to a first Rydberg energy state |3>. Therefore, the alkali metal atoms in the first Rydberg energy state |3> can be transparent with respect to light at the approximate frequency of the probe beam $OPT_{PRB}$. Furthermore, as described above, the splitting signal $RF_{SPL}$ can be provided to the sensor cell 202, which can result in Autler-Townes splitting of the transparency peak of the alkali metal atoms in the frequency spectrum. In the example of FIG. 4, the splitting signal $RF_{SPL}$ has a frequency that is less than an energy difference between the first Rydberg energy state |3> and a defined second Rydberg energy state |4>. Therefore, while the splitting signal $RF_{SPL}$ is tuned to a predetermined frequency that is approximately equal to a desired frequency of an external signal $RF_{EXT}$ to be detected, the frequency of the splitting signal $RF_{SPL}$ is not sufficient to provide a well-defined and detectable Autler-Townes pair of transparency peaks in the frequency spectrum.

As described above, the tuning signal $RF_{TN}$ can be provided to adjust the energy difference between the first Rydberg energy state |3> and the second Rydberg energy state |4>. In the example of FIG. 4, the tuning signal $RF_{TN}$ is provided at a frequency that is approximately equal to an energy difference between the second Rydberg energy state |4> and a third Rydberg energy state |5>. The third Rydberg energy state |5> can be any arbitrary Rydberg energy state which has an energy difference relative to the second Rydberg energy state |4> to which the frequency of the tuning signal $RF_{TN}$ can be set. As an example, the tuning signal $RF_{TN}$ can be provided at an amplitude that is sufficient to affect the energy associated with the second and third Rydberg energy states |4> and |5>. Therefore, in the example of FIG. 4, the second and third Rydberg energy states |4> and |5> are adjusted, such that the energy associated with the second and third Rydberg energy states |4> and |5> is changed for the population of the alkali metal atoms.

In the example of FIG. 4, the energy associated with the second Rydberg energy state |4> is adjusted to a lesser energy relative to the first Rydberg energy state |3>, and is thus decreased to decrease the energy difference between the first Rydberg energy state |3> and the second Rydberg energy state |4>. As a result, the difference between the first Rydberg energy state |3> and the second Rydberg energy state |4> can be adjusted to be approximately equal to the frequency of the splitting signal $RF_{SPL}$. Therefore, the splitting signal $RF_{SPL}$ provided to the alkali metal atoms can result in a well-defined and detectable Autler-Townes pair of transparency peaks in the frequency spectrum. Accordingly, an external signal $RF_{EXT}$ having a frequency that is approximately equal to the frequency of the splitting signal $RF_{SPL}$ can be detected based on the well-defined and detectable Autler-Townes pair of transparency peaks in the frequency spectrum.

Referring back to the example of FIG. 2, the electrometer system 200 further includes a detection system 212 that is configured to monitor the detection beam $OPT_{DET}$ to detect the external signal $RF_{EXT}$. In the example of FIG. 2, the detection system 212 includes a photodetector 224 (e.g., a photodiode) and a detection processor 226. The photodetector 224 can monitor the intensity and/or phase of the detection beam $OPT_{DET}$ and generate an electric signal, demonstrated in the example of FIG. 2 as a voltage $V_{DET}$ that corresponds to the intensity of the detection beam $OPT_{DET}$. As described above, the splitting signal $RF_{SPL}$ can provide a defined pair of Autler-Townes frequency-spectrum transparency peaks associated with the alkali metal atoms in response to the splitting signal $RF_{SPL}$ having a frequency that is approximately equal to the energy difference between the first Rydberg energy state |3> and the adjusted second Rydberg energy state |4>. Therefore, in response to the tuning signal $RF_{TN}$ adjusting the energy difference between the first Rydberg energy state |3> and the second Rydberg energy state |4>, the splitting signal $RF_{SPL}$ can provide the defined Autler-Townes pair of transparency peaks in the frequency spectrum of the detection beam $OPT_{DET}$.

The detection processor 226 can thus determine a change in the pair of Autler-Townes frequency-spectrum transparency peaks that correspond to the presence of the external signal. The detection processor 226 can thus determine characteristics associated with the external signal $RF_{EXT}$, such as demodulation of the $RF_{EXT}$. As a result, an external signal $RF_{EXT}$ having a frequency that is approximately equal to the frequency of the splitting signal $RF_{SPL}$, and thus approximately equal to the energy difference between the adjusted second Rydberg energy state |4> and the first Rydberg energy state |3>, can be detected. Accordingly, by being able to tune the energy difference between the first and second Rydberg energy states, the electrometer system 200 can be tuned to detect an external signal having substantially any frequency based on discrete Rydberg energy states.

As described herein, the relative energy levels of the Rydberg energy states are arbitrary, such that the first, second, and third Rydberg energy states |3>, |4>, and |5> can be greater than or less than each other in any order. Thus, any Rydberg energy levels of known energy differences between each other can be implemented for setting the first Rydberg energy state |3> and for tuning the tuning signal $RF_{TN}$ to detect the external signal $RF_{EXT}$. Additionally, as described above in the example of FIG. 4, the second Rydberg energy state |4> can be adjusted relative to the first Rydberg energy state |3>. However, as further described in the example of FIG. 5, the first Rydberg energy state |3> can instead be adjusted relative to the second Rydberg energy state |4>.

FIG. 5 illustrates an example of an energy state diagram 500. The diagram 500 can correspond to optical detection in the electrometer system 200. Therefore, reference is to be made to the example of FIG. 2 in the following description of the example of FIG. 5.

The energy state diagram 502 demonstrates a first energy state (e.g., ground state) |1> at which the alkali metal atoms can begin. In response to the probe beam $OPT_{PRB}$, a population of the alkali metal atoms can be excited to a first excited state |2>. In response to the coupling beam $OPT_{CPL}$, a population of the excited alkali metal atoms can be further excited to a first Rydberg energy state |3>. Therefore, the alkali metal atoms in the first Rydberg energy state |3> can be transparent with respect to light at the approximate frequency of the probe beam $OPT_{PRB}$. Furthermore, as described above, the splitting signal $RF_{SPL}$ can be provided to the sensor cell 202, which can result in Autler-Townes splitting of the transparency peak of the alkali metal atoms in the frequency spectrum. In the example of FIG. 5, the splitting signal $RF_{SPL}$ has a frequency that is less than an energy difference between the first Rydberg energy state |3> and a defined second Rydberg energy state |4>. Therefore, while the splitting signal $RF_{SPL}$ is tuned to a predetermined frequency that is approximately equal to a desired frequency of an external signal $RF_{EXT}$ to be detected, the frequency of the splitting signal $RF_{SPL}$ is not sufficient to provide a well-defined and detectable Autler-Townes pair of transparency peaks in the frequency spectrum.

As described above, the tuning signal $RF_{TN}$ can be provided to adjust the energy difference between the first Rydberg energy state |3> and the second Rydberg energy state |4>. In the example of FIG. 5, the tuning signal $RF_{TN}$ is provided at a frequency that is approximately equal to an energy difference between the first Rydberg energy state |3> and a third Rydberg energy state |5>. The third Rydberg energy state |5> can be any arbitrary Rydberg energy state which has an energy difference relative to the first Rydberg energy state |3> to which the frequency of the tuning signal $RF_{TN}$ can be set. As an example, the tuning signal $RF_{TN}$ can be provided at an amplitude that is sufficient to affect the energy associated with the first and third Rydberg energy states |3> and |5>. Therefore, in the example of FIG. 5, the first and third Rydberg energy states |3> and |5> are adjusted, such that the energy associated with the first and third Rydberg energy states |4> and |5> is changed for the population of the alkali metal atoms.

In the example of FIG. 5, the energy associated with the first Rydberg energy state |3> is adjusted to a lesser energy relative to the second Rydberg energy state |4>, and is thus decreased to decrease the energy difference between the first Rydberg energy state |3> and the second Rydberg energy state |4>. As a result, the difference between the first Rydberg energy state |3> and the second Rydberg energy state |4> can be adjusted to be approximately equal to the frequency of the splitting signal $RF_{SPL}$. Therefore, the splitting signal $RF_{SPL}$ provided to the alkali metal atoms can result in a well-defined and detectable Autler-Townes pair of transparency peaks in the frequency spectrum. Accordingly, an external signal $RF_{EXT}$ having a frequency that is approximately equal to the frequency of the splitting signal $RF_{SPL}$ can be detected based on the well-defined and detectable Autler-Townes pair of transparency peaks in the frequency spectrum, similar to as described above.

The example of FIG. 5 therefore demonstrates that the first Rydberg energy state |3> can be adjusted relative to the second Rydberg energy state |4>, as opposed to the opposite demonstrated in the example of FIG. 4. However, in the example of FIG. 5, because the first Rydberg energy state |3> is provided based on excitation of the alkali metal atoms by the probe beam $OPT_{PRB}$ and the coupling beam $OPT_{CPL}$, the frequency of the coupling beam $OPT_{CPL}$ could become off resonance of the first Rydberg energy state |3> as a result of the adjustment of the energy level of the first Rydberg energy state |3>. Therefore, the wavelength tuning signal TN described above in the example of FIG. 1 can be implemented to tune the wavelength of the coupling beam $OPT_{CPL}$. Therefore, the wavelength tuning signal TN can adjust the wavelength of the coupling beam $OPT_{CPL}$ to compensate for the adjustment of the first Rydberg energy state |3> to maintain sufficient excitation of the population of the alkali metal atoms in the associated first Rydberg energy state |3>. Accordingly, as the first Rydberg energy state |3> is adjusted by the tuning signal $RF_{TN}$, the wavelength tuning signal TN can compensate for the energy required by the frequency of the coupling beam $OPT_{CPL}$ to maintain the population of the alkali atoms in the first Rydberg energy state |3>.

Figure 6:
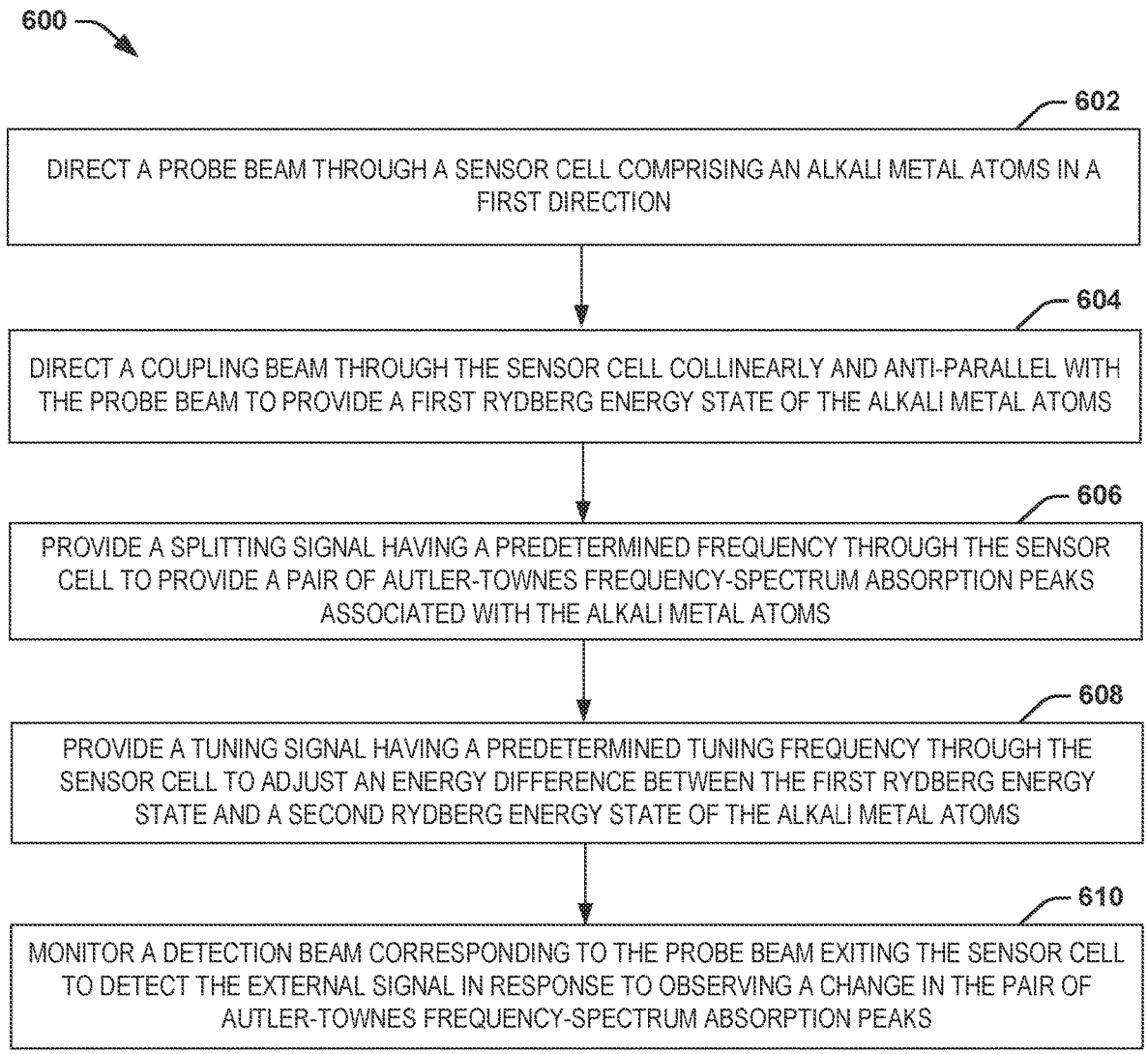
FIG. 6 illustrates an example of a method for detecting an external signal via an electrometer system.

In view of the foregoing structural and functional features described above, a methodology in accordance with various aspects of the disclosure will be better appreciated with reference to FIG. 6. It is to be understood and appreciated that the method of FIG. 6 is not limited by the illustrated order, as some aspects could, in accordance with the present disclosure, occur in different orders and/or concurrently with other aspects from that shown and described herein. Moreover, not all illustrated features may be required to implement a methodology in accordance with an aspect of the present examples.

FIG. 6 illustrates an example of a method 600 for detecting an external signal (e.g., the external signal $RF_{EXT}$) via an electrometer system (e.g., the electrometer system 100). At 602, a probe beam (e.g., the probe beam $OPT_{PRB}$) is directed through a sensor cell (e.g., the sensor cell 102) comprising an alkali metal atoms in a first direction. At 604, a coupling beam (e.g., the coupling beam $OPT_{EXT}$) is directed through the sensor cell collinearly and anti-parallel with the probe beam to provide a first Rydberg energy state of the alkali metal atoms. At 606, a splitting signal (e.g., the splitting signal $RF_{SPL}$) having a predetermined frequency is provided through the sensor cell to provide a pair of Autler-Townes frequency-spectrum transparency peaks associated with the alkali metal atoms. At 608, a tuning signal (e.g., the tuning signal $RF_{TN}$) having a predetermined tuning frequency is provided through the sensor cell to adjust an energy difference between the first Rydberg energy state and a second Rydberg energy state of the alkali metal atoms. At 610, a detection beam (e.g., the detection beam $OPT_{DET}$) corresponding to the probe beam exiting the sensor cell is monitored to detect the external signal in response to observing a change in the pair of Autler-Townes frequency-spectrum transparency peaks.

What have been described above are examples of the present invention. It is, of course, not possible to describe every conceivable combination of components or methodologies for purposes of describing the present invention, but one of ordinary skill in the art will recognize that many further combinations and permutations of the present invention are possible. Accordingly, the present invention is intended to embrace all such alterations, modifications and variations that fall within the spirit and scope of the appended claims. Additionally, where the disclosure or claims recite "a," "an," "a first," or "another" element, or the equivalent thereof, it should be interpreted to include one or more than one such element, neither requiring nor excluding two or more such elements. As used herein, the term "includes" means includes but not limited to, and the term "including" means including but not limited to. The term "based on" means based at least in part on.

What is claimed is:

1. An electrometer system comprising:
a sensor cell comprising alkali metal atoms within;
an optical beam system configured to provide at least one optical beam through the sensor cell to provide a first Rydberg energy state of the alkali metal atoms, the at least one optical beam exiting the sensor cell as a detection beam;
a tuning signal generator configured to generate an RF tuning signal having a predetermined tuning frequency to adjust an energy difference between the first Rydberg energy state and a second Rydberg energy state of the alkali metal atoms, the RF tuning signal being set to the predetermined tuning frequency that is a frequency between the second Rydberg energy state and a third Rydberg energy state to adjust the energy difference between the first and second Rydberg energy states of the alkali metal atoms; and
a detection system configured to monitor the detection beam to detect an external signal having a frequency that is approximately equal to the energy difference between the first Rydberg energy state and the second Rydberg energy state based on monitoring the detection beam.

2. The system of claim 1, wherein the tuning signal is provided at sufficient power to adjust the energy difference between the first and second Rydberg energy states of the alkali metal atoms.

3. The system of claim 1, further comprising a splitting signal generator configured to generate a splitting signal having a predetermined frequency through the sensor cell to provide a pair of Autler-Townes frequency-spectrum transparency peaks associated with the alkali metal atoms when the adjusted energy difference between the first Rydberg energy state and the second Rydberg energy state is approximately equal to the frequency of the splitting signal, wherein the detection system is configured to detect the external signal in response to observing a change in the pair of Autler-Townes frequency-spectrum transparency peaks based on monitoring the detection beam.

4. The system of claim 1, wherein the tuning signal generator is configured to generate the tuning signal having a predetermined tuning frequency to adjust the second Rydberg energy state of the alkali metal atoms relative to the first Rydberg energy state of the alkali metal atoms.

5. The system of claim 1, wherein the tuning signal generator is configured to generate the tuning signal having a predetermined tuning frequency to adjust the first Rydberg energy state of the alkali metal atoms relative to the second Rydberg energy state of the alkali metal atoms.

6. The system of claim 5, wherein the optical beam system is configured to receive a wavelength tuning signal to adjust a wavelength of a coupling beam of the at least one optical beam to compensate for the adjusted first Rydberg energy state.

7. The system of claim 1, wherein the optical system comprises:

a probe laser configured to generate a probe beam directed through the sensor cell in a first direction, the probe beam exiting the sensor cell as the detection beam; and a coupling laser configured to generate a coupling beam directed through the sensor cell collinearly and anti-parallel with the probe beam to provide a first Rydberg energy state of the alkali metal atoms.

8. The system of claim 4, further comprising optics configured to collimate the probe beam and the coupling beam to provide the probe beam and the coupling beam to be collinear and anti-parallel with respect to each other, such that the detection system is configured to monitor the detection beam along an axis through the sensor cell to detect the external signal.

9. A method for detecting an external signal via an electrometer system, the method comprising:

directing a probe beam through a sensor cell comprising an alkali metal atoms in a first direction;

directing a coupling beam through the sensor cell to provide a first Rydberg energy state of the alkali metal atoms based on the probe beam and the coupling beam;

providing a splitting signal having a predetermined frequency through the sensor cell to provide a pair of Autler-Townes frequency-spectrum transparency peaks associated with the alkali metal atoms;

providing an RF tuning signal having a predetermined tuning frequency through the sensor cell to adjust an energy difference between the first Rydberg energy state and a second Rydberg energy state of the alkali metal atoms; and monitoring a detection beam corresponding to the probe beam exiting the sensor cell to detect the external signal in response to observing a change in the pair of Autler-Townes frequency-spectrum transparency peaks.

10. The method of claim 9, further comprising setting the predetermined tuning frequency to a frequency between the second Rydberg energy state and a third Rydberg energy state to adjust the energy difference between the first and second Rydberg energy states of the alkali metal atoms.

11. The method of claim 9, further comprising setting the predetermined tuning frequency to adjust the second Rydberg energy state of the alkali metal atoms relative to the first Rydberg energy state of the alkali metal atoms.

12. The method of claim 9, further comprising setting the predetermined tuning frequency to adjust the first Rydberg energy state of the alkali metal atoms relative to the second Rydberg energy state of the alkali metal atoms.

13. The method of claim 12, further comprising providing a wavelength tuning signal to the coupling beam to adjust a wavelength of the coupling beam to compensate for the adjusted first Rydberg energy state.

14. The method of claim 9, further comprising collimating the probe beam and the coupling beam to provide the probe beam and the coupling beam to be collinear and anti-parallel with respect to each other, wherein monitoring the detection beam comprises monitoring the detection beam along an axis through the sensor cell to detect the external signal.

15. An electrometer system comprising:

a sensor cell comprising alkali metal atoms within;

a probe laser configured to generate a probe beam directed through the sensor cell in a first direction, the probe beam exiting the sensor cell as the detection beam;

a coupling laser configured to generate a coupling beam directed through the sensor cell to provide a first Rydberg energy state of the alkali metal atoms based on the probe beam and the coupling beam;

a tuning signal generator configured to generate an RF tuning signal having a predetermined tuning frequency to adjust an energy difference between the first Rydberg energy state and a second Rydberg energy state of the alkali metal atoms; and a detection system configured to monitor the detection beam to detect an external signal having a frequency that is approximately equal to the energy difference between the first Rydberg energy state and the second Rydberg energy state based on monitoring the detection beam.

16. The system of claim 15, further comprising a splitting signal generator configured to generate a splitting signal having a predetermined frequency through the sensor cell to provide a pair of Autler-Townes frequency-spectrum transparency peaks associated with the alkali metal atoms when the adjusted energy difference between the first Rydberg energy state and the second Rydberg energy state is approximately equal to the frequency of the splitting signal, wherein the detection system is configured to detect the external signal in response to observing a change in the pair of Autler-Townes frequency-spectrum transparency peaks based on monitoring an intensity of the detection beam.

17. The system of claim 15, wherein the tuning signal generator is configured to generate the tuning signal having a predetermined tuning frequency to adjust the second Rydberg energy state of the alkali metal atoms relative to the first Rydberg energy state of the alkali metal atoms.

18. The system of claim 15, wherein the tuning signal generator is configured to generate the tuning signal having a predetermined tuning frequency to adjust the first Rydberg energy state of the alkali metal atoms relative to the second Rydberg energy state of the alkali metal atoms.

19. The system of claim 18, wherein the optical beam system is configured to receive a wavelength tuning signal to adjust a wavelength of a coupling beam of the at least one optical beam to compensate for the adjusted first Rydberg energy state.

* * * * *